(12) United States Patent
Mao et al.

(10) Patent No.: US 11,704,449 B1
(45) Date of Patent: Jul. 18, 2023

(54) CONSTRUCTION METHOD OF MINE INTELLIGENT MANAGEMENT AND CONTROL PLATFORM BASED ON GEOLOGICAL SURVEY GUARANTEE SYSTEM

(71) Applicant: Beijing LongRuan Technologies INC., Beijing (CN)

(72) Inventors: Shanjun Mao, Beijing (CN); Xiang Li, Beijing (CN); Chao Jing, Beijing (CN)

(73) Assignee: BEIJING LONGRUAN TECHNOLOGIES INC., Beijing (CN)

( * ) Notice: Subject to any disclaimer, the term of this patent is extended or adjusted under 35 U.S.C. 154(b) by 0 days.

(21) Appl. No.: 17/956,862

(22) Filed: Sep. 30, 2022

(30) Foreign Application Priority Data

May 12, 2022 (CN) .......................... 202210511857.4

(51) Int. Cl.
 *G06F 30/12* (2020.01)
 *G01V 1/50* (2006.01)
 *G06T 17/05* (2011.01)

(52) U.S. Cl.
 CPC ................ *G06F 30/12* (2020.01); *G01V 1/50* (2013.01); *G06T 17/05* (2013.01)

(58) Field of Classification Search
 CPC .......... G06F 30/12; G06F 30/00; G06F 30/17; G06F 30/18; G01V 1/50; G06T 17/05
 See application file for complete search history.

(56) References Cited

U.S. PATENT DOCUMENTS 11,118,102 B2   9/2021 Pu et al.
2004/0145614 A1  7/2004 Takagaki et al.
(Continued)

FOREIGN PATENT DOCUMENTS

CN   109949007 A   6/2019
CN   110568829 A   12/2019
(Continued)

OTHER PUBLICATIONS

Hao Wang et al, "Construction of Cloud Platform for Mining Group Operation," 2019 J. Phys.: Conf. Ser. 1302 042028 (Year: 2019).*
(Continued)

*Primary Examiner* — Steven W Crabb
(74) *Attorney, Agent, or Firm* — Bayramoglu Law Offices LLC

(57) ABSTRACT

A construction method of mine intelligent management and control platform based on a geological survey guarantee system includes: constructing a unified data center and a multi-dimensional (x, y), (x, y, t), (x, y, z) and (x, y, z, t) geological survey guarantee system platform, and realizing dynamic processing and multi-dimensional visual exhibition of geological survey data, to complete construction of the basic mine intelligent management and control platform and a visual operation interface; by using the multi-dimensional geological survey guarantee system as a base, constructing and accessing scenes and data of different types of safe-production systems, to realize visualized patrolling inspection, digital twinning and remote industrial control; and realizing deep fusion, decision-making analysis and visual cooperative management and control of multi-source geological survey data and data of safe production and operation, to form the mine intelligent management and control platform.

8 Claims, 2 Drawing Sheets

(56) References Cited

U.S. PATENT DOCUMENTS

2009/0303233 A1    12/2009  Lin et al.
2022/0284671 A1*    9/2022  Baker ..................... G01V 8/02

FOREIGN PATENT DOCUMENTS

| | | |
|---|---|---|
| CN | 111273352 A | 6/2020 |
| CN | 110568829 B | 3/2021 |
| CN | 112613805 A | 4/2021 |
| EA | 033897 B1 | 12/2019 |
| RU | 2462755 C2 | 9/2012 |

OTHER PUBLICATIONS

Yixin Huachen, How to realize intelligent integration for the intelligent mine in the era of big Data?, Baidu, 2020, pp.1-4.
Introduction of five major core technologies in the construction of an intelligent mining system, Adinnet, 2021, pp. 1-6.

* cited by examiner

CONSTRUCTION METHOD OF MINE INTELLIGENT MANAGEMENT AND CONTROL PLATFORM BASED ON GEOLOGICAL SURVEY GUARANTEE SYSTEM

CROSS REFERENCE TO THE RELATED APPLICATIONS

This application is based upon and claims priority to Chinese Patent Application No. 202210511857.4, filed on May 12, 2022, the entire contents of which are incorporated herein by reference.

TECHNICAL FIELD

The present disclosure relates to the technical field of mine intelligent exploitation, and more particularly, to a construction method of mine intelligent management and control platform and a construction apparatus of mine intelligent management and control platform based on a geological survey guarantee system.

BACKGROUND

Currently, the geophysical guarantee is used throughout the different stages of coal exploitation such as coal-field exploration, mine design, exploitation and excavation, safe mining, and coal utilization, and is the most important basic guarantee for intelligent mines. Without the geophysical guarantee, there will be no intelligent exploitation, intelligent excavation, and intelligent mines. An intelligent comprehensive management and control platform provides automatic and information support for the realization of mine intellectualization, to further realize the coordinated scheduling and control centralized control of safe production.

All of the daily operations of mines are for the purpose of safely and efficiently exploiting ore masses such as a coal bed. The geophysical information relative to ore masses such as a coal bed and the relevant stratum is important basic information for ensuring the safe production of mines, and is used throughout the full process of mining. The intelligent comprehensive management and control platforms that are currently used still employ the traditional management and control modes, mainly including two methods. The first method includes, based on the industrial configuration, merely illustratively exhibiting the distribution of the laneways and the stopes, but it does not include the geographic coordinates and the true spatial distribution of the mine management objects. The second method is based on planar or three-dimensional graphics of the measured laneways, although it includes geographic coordinates, the method uses a single type of geological survey data, lacks integrated exhibition of more important multi-source basic geophysical data and data of factors of hidden disasters causing and disasters that serve for the safe production of mines, cannot perform comprehensive analysis and decision making on the full process of mine exploitation including the factors of hidden disaster causing and disasters based on the unified platform and multi-source geological survey data, and cannot fully satisfy the current requirements of intelligent and unmanned mining at present.

SUMMARY

In view of the above problems, the present disclosure provides a method for constructing an mine intelligent management and control platform and an apparatus for constructing an mine intelligent management and control platform based on a geological survey guarantee system.

An embodiment of the present disclosure provides a method for constructing an mine intelligent management and control platform based on a geological survey guarantee system, wherein the method includes the steps of:

step 1: establishing a unified data standard, and constructing a unified data center including multi-source geological survey data and business system data of safe production and operation, to realize unified storage and management of data;

step 2: based on a geographic information system GIS or a computer-aided design CAD technique and system designing, constructing a multi-dimensional (x, y), (x, y, t), (x, y, z) and (x, y, z, t) geological survey guarantee system using the unified data center as a data source, to complete construction of the basic mine intelligent management and control platform and a visual operation interface;

step 3: according to engineering exploration and production variation, realizing dynamic construction and automatic updating based on multi-dimensional visual geological survey data in the multi-dimensional geological survey guarantee system;

step 4: by using the multi-dimensional geological survey guarantee system as a base, constructing and accessing scenes and data of different types of safe-production systems in the mine intelligent management and control platform, to further realize visualized patrolling inspection, digital twinning and remote industrial control; and step 5: according to the multi-dimensional geological survey guarantee system, realizing fusion of the multi-source geological survey data and the business system data of safe production and operation, and analysis, decision making and visual exhibition of data of predicting and warning of hidden disaster causing and safe production and operation, to form the mine intelligent management and control platform based on the multi-dimensional geological survey guarantee system as the base.

Optionally, the unified data standard includes: a unified master-data standard, a unified data-interface standard, a unified GIS or CAD standard and a unified hardware-system data-interface standard; and the step of constructing the unified data center including the multi-source geological survey data and the business system data of safe production and operation includes:

for the multi-source geological survey data and the business system data of safe production and operation, according to the unified data-interface standard, determining types of master data that are required to be integrated into the mine intelligent management and control platform;

according to the types of the master data, according to the unified master-data standard, performing a data unifying operation to the master data, to define identification marks of different types of the master data, wherein different identification marks represent different types of the master data; and for GIS information or CAD information contained in the multi-source geological survey data and the business system data of safe production and operation, performing unified processing according to the unified GIS or CAD standard, to obtain corresponding and unified geographic coordinates;

wherein the multi-source geological survey data include: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological realistic data, rock-or-stratum physical-property-parameter data, coal-terrane-identification data, and special-subject graphic data including results of disaster analysis on geological structure, hydrology, gas, spontaneous combustion of coal bed and mine ground pressure; and the business system data of safe production and operation include: risk-management and control data, hidden-trouble-investigation data, safe-production-standardization data, three-violation-management data, weak-personnel-management data, emergency-rescue data, comprehensive-dispatching data, production-management data, electro-mechanical-transportation data, One-Ventilation-and-Three-Prevention data, monitoring data, excavation data, comprehensive-automation-and-intellectualization data, and special-subject graphic data other than geological survey.

Optionally, the multi-source geological survey data include: geological survey information that reflects a geographic-coordinate location and has a multi-dimensional geographic-coordinate feature;

the multi-source geological survey data are basic geographical and space-time information for ensuring normal exploitation of a mine, has a multi-dimensional geographic-coordinate feature, and have data-presentation forms including (x, y), (x, y, t), (x, y, z) and (x, y, z, t);

the geographic-coordinate location is a spatial position that is capable of reflecting a location of a geological body, and describes a spatial position between the geological body and a laneway and a working face by using a coordinate system, and in the multi-dimensional (x, y), (x, y, t), (x, y, z) and (x, y, z, t) geological survey guarantee system, x represents a horizontal coordinate describing the geological body based on the coordinate system, y represents a vertical coordinate describing the geological body based on the coordinate system, and z represents an attribute value including an elevation or a stratum thickness describing the geological body based on the coordinate system, wherein t represents time information;

the step of constructing the multi-dimensional (x, y), (x, y, t), (x, y, z) and (x, y, z, t) geological survey guarantee system using the unified data center as the data source, to construct the basic mine intelligent management and control platform includes:

based on the multi-dimensional geographic-coordinate feature, by using the geographic information system GIS or the computer-aided design CAD technique and system, designing and constructing the multi-dimensional geological survey guarantee system, wherein the system exhibits in a two-dimensional, three-dimensional or four-dimensional mode;

in the construction of the basic mine intelligent management and control platform, the basic platform uses complete basic geological survey information and the results of data processing and analysis in the multi-dimensional geological survey guarantee system as a basis for storage and exhibition of the mine intelligent management and control platform, wherein the complete basic geological survey information refers to geological data and engineering data having multi-dimensional geographic coordinates, the geological data refer to survey data including coal bed, terrane, aquiclude, mine pressure and gas, geological structure and results of working-face coal-terrane identification that are acquired by exploratory boring, geophysical prospecting, chemical exploration and laneway sketching;

the measurement data refer to surveying-and-mapping data of earth surface, laneway, working face and goaf that are formed by engineering construction in a process of mine construction;

the results of data processing and analysis refer to morphologies and characteristics of coal bed or stratum and conditions of spatial distribution of laneway, geological reserve, construction, hydrology, gas, mine pressure and rock-or-stratum physical-property parameter that are obtained by processing and professional analysis on the basic geological survey information;

the visual operation interface displays the complete basic geological survey information and the results of data processing and analysis on a screen by using the geographic information system GIS or computer-aided design CAD technique, and is capable of operating the displayed interface;

a mode of the visualization includes a two-dimensional mode, a three-dimensional mode and a four-dimensional mode, and the operating refers to interaction with the multi-dimensional basic geological survey information and the results of data processing and analysis in the visual interface by using a mouse, a keyboard, screen touching and voice controlling;

the geological-guarantee function includes: storing, exhibiting, inquiring and operating spatial distribution of laneways, coal beds and other stratums, and an abnormal region and an abnormal value, and exhibiting essential information and abnormal information of stope faces and driving working faces, wherein the abnormal region refers to a region where mine pressure, gas or hydrology is abnormal or a region where a coal bed has a characteristic of spontaneous combustion;

the multi-dimensional geological survey guarantee system should have basic features including a system-architecture-mode feature, an essential-information-exhibition feature, and a time-space analysis-and-application feature;

the system-architecture-mode feature refers to that an architecture of the multi-dimensional geological survey guarantee system supports architectures of B/S and C/S, and satisfies a mode of cloud deployment;

the essential-information-exhibition feature refers to that the multi-dimensional geological survey guarantee system realizes visual exhibition of the multi-source geological survey data, including: coal-bed information, coal-bed-spontaneous-combustion feature information, drilling information, fault information, laneway information, pools-zone information, goaf information, collapse-column information, and gas-and-mine-pressure abnormal-region information, and a mode of the exhibition includes a two-dimensional mode, a three-dimensional mode and a four-dimensional mode;

the time-space analysis-and-application feature refers to that the multi-dimensional geological survey guarantee system performs visual exhibition and inquiring of abnormal regions and abnormal values of mine pressure, gas, hydrology, and characteristic of spontaneous combustion of coal bed, exhibits essential information and abnormal information of stope faces and driving working faces, and is capable of, based on a geological survey model and an engineering-data model, exhibiting coal-mine stratum, geological structure, coal bed, coal quality, gas, hydrogeology and other geological conditions, geological features and change rules; and the multi-dimensional geological survey guarantee system has relevant geological-survey-guaranteeing-type functions of high-precision geological modeling, laneway modeling, transparent working face, three-dimensional-space-information analysis and historical-data consulting, and hidden-disaster-causing analysis, wherein the hidden-disaster-causing analysis refers to performing predicting and warning analysis on mine hazard sources and disaster data.

Optionally, the data of engineering exploration and production variation include: multi-dimensional graphics or models processed based on a GIS or CAD system; and the step of, based on the GIS or CAD technique, according to engineering exploration and production variation, realizing dynamic construction and automatic updating based on the multi-dimensional visual geological survey data in the multi-dimensional geological survey guarantee system includes:

receiving the graphics or geological-survey-description information, and by using a visualization software, performing data processing to the graphics or geological-survey-description information, wherein the data processing includes performing unified processing based on the unified GIS or CAD standard, to convert and process coordinates in the graphics into corresponding and unified geographic coordinates, and simultaneously obtain a graphic or model result;

based on the graphic or model result formed after the unified processing, performing dynamic construction to the multi-dimensional visual geological data in the multi-dimensional geological survey guarantee system, wherein the dynamic construction includes: performing high-precision modeling to geological bodies including coal bed, drilled hole, fault, laneway, pools zone, goaf and collapse column, and verifying and correcting existing geological survey information or newly establishing non-existing geological survey information; and according to data changing caused by exploration along with exploitation, exploration along with excavation and production variation, further according to the unified data standard, realizing data processing and storing and entering into the data center, by using a function of automatic updating of geological bodies and laneway engineering, performing automatic updating of the multi-dimensional visual geological survey data in the multi-dimensional geological survey guarantee system.

Optionally, the step of, by using the multi-dimensional geological survey guarantee system as the base, constructing and accessing the scenes and data of different types of safe-production systems in the mine intelligent management and control platform, to further realize visualized patrolling inspection, digital twinning and remote industrial control includes:

by using the multi-dimensional geological survey guarantee system as a base, constructing and accessing scenes and data of different types of safe-production systems in the mine intelligent management and control platform, wherein the multi-dimensional geological survey guarantee system serving as the base is a basis and support of the mine intelligent management and control platform, by using the complete basic geological survey information, provides multi-dimensional geographic coordinates of application scenes of subsystems of the mine intelligent management and control platform, provides a visual basic manipulating interface for the mine intelligent management and control platform, and carries visualized patrolling inspection, digital twinning and remote industrial control of the subsystems;

performing delicate modeling of the scenes of the different types of safe-production systems by three-dimensional modeling, to obtain three-dimensional models of the scenes of the different types of safe-production systems;

accessing real-time operation states of the different types of safe-production systems in the scenes of the different types of safe-production systems into the three-dimensional models, to realize the digital twinning;

in the scenes of the different types of safe-production systems, simulating a personnel-in-well-patrolling-inspection path, to realize personnel in-well patrolling inspection in a virtual environment, patrolling-inspecting whether an abnormality exists in the scenes of the different types of safe-production systems, and generating a corresponding patrolling-inspecting report, to realize the visualized patrolling inspection; and accessing manipulating instructions of the different types of safe-production systems into the three-dimensional models, and by remote instruction dispatching, realizing the remote industrial control, including providing cutting-line geological information to excavation equipment, to realize deep coupling and action of the excavation equipment and the geological model;

wherein the different types of safe-production systems include: a monitor-type system, a comprehensive automation-and-intellectualization-type system and a safe-production-and-operation business managing system;

the monitor-type system includes: mine monitoring systems including safety monitoring, personnel-position monitoring, industrial video monitoring, mine-pressure monitoring, rock-burst monitoring, beam-tube monitoring, hydrogeology monitoring, gas extraction, side-slope monitoring, and road maintenance and monitoring;

the comprehensive automation-and-intellectualization-type system includes: comprehensive automation systems including coal mining, excavation, main-coal-flow transportation, water supplying and draining, ventilation, wind-suppression self-aid, electric-power supplying, coal bunker, auxiliary transportation management, well-vertical-movement drone, unmanned truck, rotating-bucket-excavator monitoring, reversed-loader monitoring, dumping-plough monitoring and dragline-shovel-electrical system; and the safe-production-and-operation business managing system includes: business systems including production-technique management, production-dispatching management, One-Ventilation-and-Three-Prevention management, safety management, geological survey water-preventing-and-treating management, mechanical and electric management, energy conservation and environment protection, and selling.

Optionally, the step of, according to the multi-dimensional geological survey guarantee system, realizing the fusion of the multi-source geological survey data and the business system data of safe production and operation, and analysis, decision making and visual exhibition of data of predicting and warning of hidden disaster causing and safe production and operation, to form the mine intelligent management and control platform based on the multi-dimensional geological survey guarantee system as the base includes:

based on the multi-dimensional geological survey guarantee system, fusing the multi-source geological survey data and the business system data of safe production and operation, by using a predicting model and a decision making model, processing real-time production data, obtaining results of data analysis of hidden disaster causing and safe production and operation, and performing visual exhibition, so that the mine intelligent management and control platform has functions of predicting and warning of hidden disaster causing, intelligent controlling, patrolling inspecting, safe-production-situation analysis, production-operation decision-making analysis and visual exhibition;

wherein the predicting and warning of hidden disaster causing refers to exhibition of predicting and warning realized by using the predicting model of data of geological hazards and hazard sources in the geological survey guarantee system serving as the base.

An embodiment of the present disclosure provides an apparatus for constructing an mine intelligent management and control platform based on a geological survey guarantee system, wherein the apparatus for constructing an mine intelligent management and control platform includes:

a data unifying module configured for establishing a unified data standard, and constructing a unified data center including multi-source geological survey data and business system data of safe production and operation, to realize unified storage and management of data;

a constructing module configured for, based on a geographic information system GIS or a computer-aided design CAD technique and system designing, constructing a multi-dimensional (x, y), (x, y, t), (x, y, z) and (x, y, z, t) geological survey guarantee system using the unified data center as a data source, to complete construction of the basic mine intelligent management and control platform and a visual operation interface;

a constructing and updating module configured for, according to engineering exploration and production variation, realizing dynamic construction and automatic updating based on multi-dimensional visual geological data in the multi-dimensional geological survey guarantee system;

a visualized patrolling inspection, digital twinning and remote industrial control module configured for, by using the multi-dimensional geological survey guarantee system as a base, constructing and accessing scenes and data of different types of safe-production systems in the mine intelligent management and control platform, to further realize visualized patrolling inspection, digital twinning and remote industrial control; and a result analyzing module configured for, according to the multi-dimensional geological survey guarantee system, realizing fusion of the multi-source geological survey data and the business system data of safe production and operation, and analysis, decision making and visual exhibition of data of predicting and warning of hidden disaster causing and safe production and operation, to form the mine intelligent management and control platform based on the multi-dimensional geological survey guarantee system as the base.

Optionally, the unified data standard includes: a unified master-data standard, a unified data-interface standard, a unified GIS or CAD standard and a unified hardware-system data-interface standard; and the data unifying module is configured for: for the multi-source geological survey data and the business system data of safe production and operation, according to the unified data-interface standard, determining types of master data that are required to be integrated into the mine intelligent management and control platform;

according to the types of the master data, according to the unified master-data standard, performing a data unifying operation to the master data, to define identification marks of different types of the master data, wherein different identification marks represent different types of the master data; and for GIS information or CAD information contained in the multi-source geological survey data and the business system data of safe production and operation, performing unified processing according to the unified GIS or CAD standard, to obtain corresponding and unified geographic coordinates;

wherein the multi-source geological survey data include: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological realistic data, rock-or-stratum physical-property-parameter data, coal-terrane-identification data, and special-subject graphic data including results of disaster analysis on geological structure, hydrology and gas; and the business system data of safe production and operation include: risk-management and control data, hidden-trouble-investigation data, safe-production-standardization data, three-violation-management data, weak-personnel-management data, emergency-rescue data, comprehensive-dispatching data, production-management data, electro-mechanical-transportation data, One-Ventilation-and-Three-Prevention data, monitoring data, excavation data, comprehensive-automation-and-intellectualization data, and special-subject graphic data other than geological survey.

Optionally, the multi-source geological survey data include: geological survey information that reflects a geographic-coordinate location and has a multi-dimensional geographic-coordinate feature;

the multi-source geological survey data are basic geographical and space-time information for ensuring normal exploitation of a mine, has a multi-dimensional geographic-coordinate feature, and have data-presentation forms including (x, y), (x, y, t), (x, y, z) and (x, y, z, t);

the geographic-coordinate location is a spatial position that is capable of reflecting a location of a geological body, and describes a spatial position between the geological body and a laneway and a working face by using a coordinate system, and in the multi-dimensional (x, y), (x, y, t), (x, y, z) and (x, y, z, t) geological survey guarantee system, x represents a horizontal coordinate describing the geological body based on the coordinate system, y represents a vertical coordinate describing the geological body based on the coordinate system, and z represents an attribute value including an elevation or a stratum thickness describing the geological body based on the coordinate system, wherein t represents time information;

the constructing module is configured for:

based on the multi-dimensional geographic-coordinate feature, by using the geographic information system GIS or the computer-aided design CAD technique and system, designing and constructing the multi-dimensional geological survey guarantee system, wherein the system exhibits in a two-dimensional, three-dimensional or four-dimensional mode;

in the construction of the basic mine intelligent management and control platform, the basic platform uses complete basic geological survey information and the results of data processing and analysis in the multi-dimensional geological survey guarantee system as a basis for storage and exhibition of the mine intelligent management and control platform, wherein the complete basic geological survey information refers to geological data and engineering data having multi-dimensional geographic coordinates, the geological data refer to survey data including coal bed, terrane, aquiclude, mine pressure and gas, geological structure and results of working-face coal-terrane identification that are acquired by exploratory boring, geophysical prospecting, chemical exploration and laneway sketching;

the measurement data refer to surveying-and-mapping data of earth surface, laneway, working face and goaf that are formed by engineering construction in a process of mine construction;

the results of data processing and analysis refer to morphologies and characteristics of coal bed or stratum and conditions of spatial distribution of laneway, geological reserve, construction, hydrology, gas, mine pressure and rock-or-stratum physical-property parameter that are obtained by processing and professional analysis on the complete basic geological survey information;

the visual operation interface displays the complete basic geological survey information and the results of data processing and analysis on a screen by using the geographic information system GIS or computer-aided design CAD technique, and is capable of operating the displayed interface;

a mode of the visualization includes a two-dimensional mode, a three-dimensional mode and a four-dimensional mode, and the operating refers to interaction with the multi-dimensional basic geological survey information and the results of data processing and analysis in the visual interface by using a mouse, a keyboard, screen touching and voice controlling;

the multi-source geological survey data include: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological realistic data, rock-or-stratum physical-property-parameter data, coal-terrane-identification data, and special-subject graphic data including results of disaster analysis on geological structure, hydrology, gas, spontaneous combustion of coal bed and mine ground pressure;

the geological-guarantee function includes: storing, exhibiting, inquiring and operating spatial distribution of laneways, coal beds and other stratums, and an abnormal region and an abnormal value, and exhibiting essential information and abnormal information of stope faces and driving working faces, wherein the abnormal region refers to a region where mine pressure, gas or hydrology is abnormal or a region where a coal bed has a characteristic of spontaneous combustion;

the multi-dimensional geological survey guarantee system should have basic features including a system-architecture-mode feature, an essential-information-exhibition feature, and a time-space analysis-and-application feature;

the system-architecture-mode feature refers to that an architecture of the multi-dimensional geological survey guarantee system supports architectures of B/S and C/S, and satisfies a mode of cloud deployment;

the essential-information-exhibition feature refers to that the multi-dimensional geological survey guarantee system realizes visual exhibition of the multi-source geological survey data, including: coal-bed information, coal-bed-spontaneous-combustion feature information, drilling information, fault information, laneway information, pools-zone information, goaf information, collapse-column information, and gas-and-mine-pressure abnormal-region information, and a mode of the exhibition includes a two-dimensional mode, a three-dimensional mode and a four-dimensional mode;

the time-space analysis-and-application feature refers to that the multi-dimensional geological survey guarantee system performs visual exhibition and inquiring of abnormal regions and abnormal values of mine pressure, gas, hydrology, and characteristic of spontaneous combustion of coal bed, exhibits essential information and abnormal information of stope faces and driving working faces, and is capable of, based on a geological survey model and an engineering-data model, exhibiting coal-mine stratum, geological structure, coal bed, coal quality, gas, hydrogeology and other geological conditions, geological features and change rules; and the multi-dimensional geological survey guarantee system has relevant geological-survey-guaranteeing-type functions of high-precision geological modeling, laneway modeling, transparent working face, three-dimensional-space-information analysis and historical-data consulting, and hidden-disaster-causing analysis, wherein the hidden-disaster-causing analysis refers to performing predicting and warning analysis on mine hazard sources and disaster data.

Optionally, the data of engineering exploration and production variation include: multi-dimensional graphics or models processed based on a GIS or CAD system; and the constructing and updating module is configured for:

receiving the graphics or geological-survey-description information, and by using a visualization software, performing data processing to the graphics or geological-survey-description information, wherein the data processing includes performing unified processing based on the unified GIS or CAD standard, to convert and process coordinates in the graphics into corresponding and unified geographic coordinates, and simultaneously obtain a graphic or model result;

based on the graphic or model result formed after the unified processing, performing dynamic construction to the multi-dimensional visual geological data in the multi-dimensional geological survey guarantee system, wherein the dynamic construction includes: performing high-precision modeling to geological bodies including coal bed, drilled hole, fault, laneway, pools zone, goaf and collapse column, and verifying and correcting existing geological survey information or newly establishing non-existing geological survey information; and according to data changing caused by exploration along with exploitation, exploration along with excavation and production variation, further according to the unified data standard, realizing data processing and storing and entering into the data center, by using a function of automatic updating of geological bodies and laneway engineering, performing automatic updating of the multi-dimensional visual geological survey data in the multi-dimensional geological survey guarantee system.

Optionally, the visualized patrolling inspection, digital twinning and remote industrial control module is configured for:

by using the multi-dimensional geological survey guarantee system as a base, constructing and accessing scenes and data of different types of safe-production systems in the mine intelligent management and control platform, wherein the multi-dimensional geological survey guarantee system serving as the base is a basis and support of the mine intelligent management and control platform, by using the complete basic geological survey information, provides multi-dimensional geographic coordinates of application scenes of subsystems of the mine intelligent management and control platform, provides a visual basic manipulating interface for the mine intelligent management and control platform, and carries visualized patrolling inspection, digital twinning and remote industrial control of the subsystems;

performing delicate modeling of the scenes of the different types of safe-production systems by three-dimensional modeling, to obtain three-dimensional models of the scenes of the different types of safe-production systems;

accessing real-time operation states of the different types of safe-production systems in the scenes of the different types of safe-production systems into the three-dimensional models, to realize the digital twinning;

in the scenes of the different types of safe-production systems, simulating a personnel-in-well-patrolling-inspection path, to realize personnel in-well patrolling inspection in a virtual environment, patrolling-inspecting whether an abnormality exists in the scenes of the different types of safe-production systems, and generating a corresponding patrolling-inspecting report, to realize the visualized patrolling inspection; and accessing manipulating instructions of the different types of safe-production systems into the three-dimensional models, and by remote instruction dispatching, realizing the remote industrial control, including providing cutting-line geological information to excavation equipment, to realize deep coupling and action of the excavation equipment and the geological model;

wherein the different types of safe-production systems include: a monitor-type system, a comprehensive automation-and-intellectualization-type system and a safe-production-and-operation business managing system;

the monitor-type system includes: mine monitoring systems including safety monitoring, personnel-position monitoring, industrial video monitoring, mine-pressure monitoring, rock-burst monitoring, beam-tube monitoring, hydrogeology monitoring, gas extraction, side-slope monitoring, and road maintenance and monitoring;

the comprehensive automation-and-intellectualization-type system includes: comprehensive automation systems including coal mining, excavation, main-coal-flow transportation, water supplying and draining, ventilation, wind-suppression self-aid, electric-power supplying, coal bunker, auxiliary transportation management, well-vertical-movement drone, unmanned truck, rotating-bucket-excavator monitoring, reversed-loader monitoring, dumping-plough monitoring and dragline-shovel-electrical system.

the safe-production-and-operation business managing system includes: business systems including production-technique management, production-dispatching management, One-Ventilation-and-Three-Prevention management, safety management, geological survey water-preventing-and-treating management, mechanical and electric management, energy conservation and environment protection, and selling.

Optionally, the result analyzing module is configured for:

based on the multi-dimensional geological survey guarantee system, fusing the multi-source geological survey data and the business system data of safe production and operation, by using a predicting model and a decision making model, processing real-time production data, obtaining results of data analysis of hidden disaster causing and safe production and operation, and performing visual exhibition, so that the mine intelligent management and control platform has functions of predicting and warning of hidden disaster causing, intelligent controlling, patrolling inspecting, safe-production-situation analysis, production-operation decision-making analysis and visual exhibition;

wherein the predicting and warning of hidden disaster causing refers to exhibition of predicting and warning realized by using the predicting model of data of geological hazards and hazard sources in the geological survey guarantee system serving as the base.

The method for constructing an mine intelligent management and control platform according to the present disclosure includes, firstly, establishing a unified data standard, and constructing a unified data center including multi-source geological survey data and business system data of safe production and operation, to realize unified storage and management of data, so that the multi-source geological survey data and the business system data of safe production and operation are stored and managed in a unified mode. Accordingly, the data that were previously separate are unified to the data center to be managed in a unified mode, which lays a good basis for the analysis and prediction of hidden hazard sources or disasters and the analysis, decision making and management on the business data of safe production and operation in the process of the mine exploitation by the mine intelligent management and control platform.

After the data unifying, the method further includes constructing a multi-dimensional (x, y), (x, y, t), (x, y, z) and (x, y, z, t) geological survey guarantee system using the unified data center as a data source, to provide a basic platform and a visual management and control interface to the mine intelligent management and control platform. Such a mode does not only realize that the multi-dimensional geological survey guarantee system has geographic coordinates, but also integrates all of the data of the unified data center into the multi-dimensional geological survey guarantee system, which provides the frame and the base for the mine intelligent management and control platform, and lays a good basis for realizing the daily management, controlling, data analysis and decision making of mine exploitation in future in the geographic environment in a more intuitive way.

After the multi-dimensional geological survey guarantee system has been constructed, the method may further include, based on the GIS or CAD technique, according to engineering exploration and production variation, realizing dynamic construction and automatic updating based on multi-dimensional visual geological data in the multi-dimensional geological survey guarantee system. That does not only ensure the visual exhibition of the latest geological survey information by the mine intelligent management and control platform, but also facilitates the analysis and prediction of hazard sources or disasters and the analysis, decision making and management on the data of safe production and operation in future.

The method further includes, taking into consideration factors of safe-production management and control, by using the multi-dimensional geological survey guarantee system as a base, constructing and accessing scenes and data of different types of safe-production systems in the mine intelligent management and control platform, to realize visualized patrolling inspection, digital twinning and remote industrial control in the geographic environment.

Finally, the method further includes, according to the multi-dimensional geological survey guarantee system, fusing the multi-source geological survey data and the business system data of safe production and operation, by using a predicting model and a decision making model, obtaining results of data analysis of hidden disaster causing and safe production and operation, and performing visual exhibition. The method realizes deep fusion of multi-source geological-disaster-type data, fully considers the feasibility of intelligent management and control using the multi-dimensional geological survey guarantee system as the base, performs comprehensive analysis and decision making to the overall process of mine exploitation including the factors of hidden disaster causing and disasters, realizes a new model of intelligent mine management and control with the geological survey multidimensional data as the basis, finally realizes the construction of the mine intelligent management and control platform based on the geological survey guarantee system, satisfies the overall requirements on intelligent and environmentally friendly mines, and satisfies the policy orientation of intelligent mine construction.

BRIEF DESCRIPTION OF THE DRAWINGS

By reading the following detailed description of the preferable embodiments, various other advantages and benefits will become clear to a person skilled in the art. The drawings are merely intended to show the preferable embodiments, and are not to be considered as limiting the present disclosure. Furthermore, throughout the drawings, the same reference signs denote the same elements. In the drawings.

DETAILED DESCRIPTION OF THE EMBODIMENTS

In order to make the above purposes, features, and advantages of the present disclosure more apparent and understandable, the present disclosure will be described in further detail below with reference to the drawings and the particular embodiments. It should be understood that the particular embodiments described herein are merely intended to interpret the present disclosure and are merely some embodiments of the present disclosure, rather than all of the embodiments, and they are not intended to limit the present disclosure.

Figure 1:
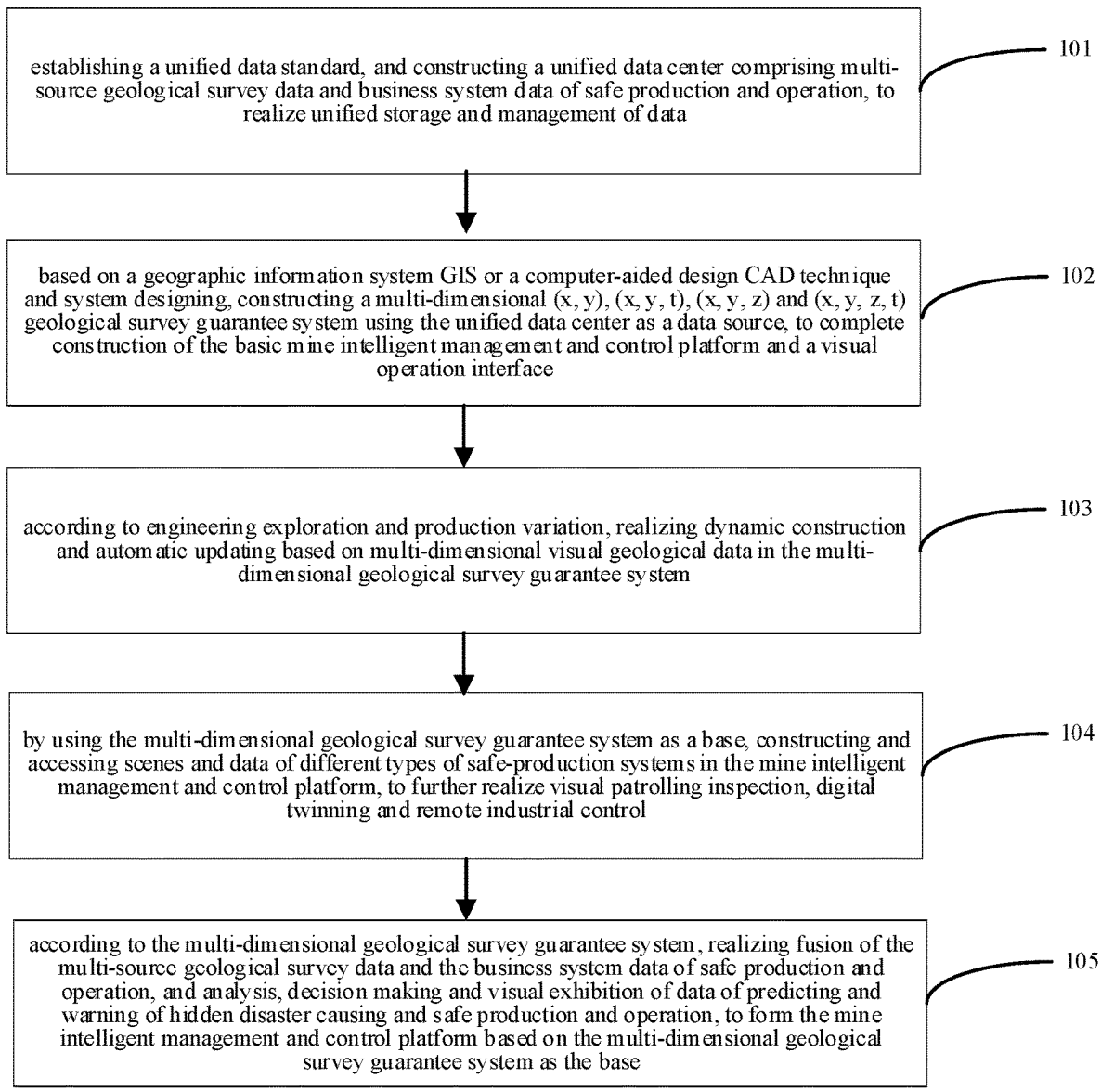
FIG. 1 is a flow chart of the method for constructing an mine intelligent management and control platform based on a geological survey guarantee system according to an embodiment of the present disclosure.

Referring to FIG. 1, which shows a flow chart of a construction method of mine intelligent management and control platform based on a geological survey guarantee system according to an embodiment of the present disclosure. The method includes:

step 101: establishing a unified data standard, and constructing a unified data center including multi-source geological survey data and business system data of safe production and operation, to realize unified storage and management of data.

The mine intelligent management and control platform according to the embodiment of the present disclosure performs data unifying operation to the previously isolated multi-source geological survey data and the business system data of safe production and operation by using the unified data standard to unify these isolated data into the data center, which lays a good foundation for the analysis and prediction of hidden hazard sources or disasters, and the analysis, decision making and management on the data of safe production and operation in the process of mining by the mine intelligent management and control platform.

The unified data standard according to an embodiment of the present disclosure includes: a unified master-data standard, a unified data-interface standard, a unified GIS or CAD standard and a unified hardware-system data-interface standard. The particular data unifying operation includes:

step S1: determining types of master data that required to be integrated into the mine intelligent management and control platform for the multi-source geological survey data and the business system data of safe production and operation according to the unified data-interface standard.

Because the data volumes of the multi-source geological survey data and the business system data of safe production and operation are very large, and these data may be obtained by using different apparatuses or different ways and methods, the types of the data are very diverse. However, not all of the types of the data are required by the mine intelligent management and control platform. Therefore, a unified data-interface standard is set to define the data of the types that are required by the mine intelligent management and control platform as the first master data, and store the first master data into the data center, and the data of the types that are not required may be added according to future demands. Certainly, the data of the types that are not required may also be deleted. In other words, the types of the master data that are required to be stored into the data center are determined according to the unified data-interface standard.

step S2: according to the types of the master data and a unified master-data standard, performing a data unifying operation to the first master data to define identification marks of the first master data, and the different identification marks represent different types of the master data.

Because there are multiple types for the master data, in order to facilitate the management of the mine intelligent management and control platform, it is required to distinguish each of the types of the master data. Therefore, according to the types of the master data and the unified master-data standard, a data unifying operation is performed to the master data, to define identification marks of different types of the master data, and the different identification marks represent different types of the master data.

step S3: for GIS information or computer-aided design CAD information included in the multi-source geological survey data and the business system data of safe production and operation, performing unified processing according to the unified GIS or CAD standard, to obtain corresponding and unified geographic coordinates.

The geographic coordinates may be contained because of the characteristic of the GIS information and the CAD information, and different coordinate systems may be defined in different graphics drawn by using different GIS systems or CAD platforms, which results in that the geographic coordinates in the GIS information and the CAD information may be inconsistent. Therefore, according to the unified GIS or CAD standard, unified processing is performed to convert the geographic coordinates in the GIS information and the CAD information into unified geographic coordinates, i.e., to obtain corresponding and unified geographic coordinates.

In an embodiment of the present disclosure, the multi-source geological survey data include: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological-survey realistic data, rock-or-stratum physical-property-parameter data, coal-terrane-identification data, and special-subject graphic data including results of disaster analysis on geological structure, hydrology and gas.

The business system data of safe production and operation include: risk-management and control data, hidden-trouble-investigation data, safe-production-standardization data, three-violation-management data, weak-personnel-management data, emergency-rescue data, comprehensive-dispatching data, production-management data, electro-mechanical-transportation data, One-Ventilation-and-Three-Prevention data, monitoring data, comprehensive-automation-and-intellectualization data, and special-subject graphic data other than geological survey and so on.

Certainly, it can be understood that all of the multi-source geological survey data and all of the business system data of safe production and operation may be unified into the data center in the above-described manner, and the above description merely illustratively describes some of the data, and does not mean that only the above-described data can be unified into the data center.

step 102: constructing a multi-dimensional (x, y), (x, y, t), (x, y, z) and (x, y, z, t) geological survey guarantee system that using the unified data center as a data source, to provide a visual management and control interface for the mine intelligent management and control platform.

In an embodiment of the present disclosure, besides the unifying of the multi-source geological survey data and the data of all of the business systems for safe production and operation, it is further required to construct a very critical system, i.e., the multi-dimensional geological survey guarantee system. The multi-dimensional geological survey guarantee system is the frame and the base of the mine intelligent management and control platform, and is the footstone for the mine intelligent management and control platform to realize the functions such as visual operation, reflection of the geographic coordinates, safety monitoring, hidden-disaster-causing analysis, and data analysis and decision making for safe production and operation. The multi-dimensional geological survey guarantee system requires to be based on the multi-source geological survey data. The multi-source geological survey data include: geological survey information that reflects a geographic-coordinate location and provided with a multi-dimensional geographic-coordinate feature. The multi-source geological survey data are basic geographical and space-time information for ensuring normal exploitation of a mine, provided with a multi-dimensional geographic-coordinate feature, and the data-presentation forms including (x, y), (x, y, t), (x, y, z) and (x, y, z, t), wherein t represents time information.

The particular steps of constructing the multi-dimensional geological survey guarantee system are as follows:

step T1: based on the multi-dimensional geographic-coordinate feature, constructing the multi-dimensional geological survey guarantee system by using the unified GIS or CAD standard and a geological modeling model, so that the mine intelligent management and control platform performs visual exhibition of the geological survey information, wherein the visual exhibition exhibits in a two-dimensional, three-dimensional or four-dimensional mode.

step T2: performing data fusion between the data of the unified data center and the multi-dimensional geological survey guarantee system, so that the mine intelligent management and control platform provides a visual management and control interface to the mine intelligent management and control platform based on the visual exhibition of the multi-source geological survey data.

Firstly, the step is based on a multi-dimensional geographic-coordinate feature, for example, coordinates in the form of (x, y), (x, y, t), (x, y, z) and (x, y, z, t), wherein x represents a horizontal coordinate describing the geological body based on the coordinate system, y represents a vertical coordinate describing the geological body based on the coordinate system, and z represents an attribute value including an elevation or a stratum thickness describing the geological body based on the coordinate system, wherein t represents time information. The unified GIS or CAD standard is used for the processing. Certainly, if the multi-dimensional geographic coordinates are consistent with the unified GIS or CAD standard, the processing is not required. Subsequently, by using the GIS or CAD technique and system, the multi-dimensional geological survey guarantee system is designed and constructed. The multi-dimensional geological survey guarantee system can enable the mine intelligent management and control platform to perform visual exhibition of the multi-source geological survey data, wherein the visual exhibition exhibits in a two-dimensional, three-dimensional or four-dimensional mode. For example, the coordinates in the form of (x,y) are exhibited in the two-dimensional mode, the coordinates in the form of (x, y, t) or (x, y, z) are exhibited in the three-dimensional mode, and the coordinates in the form of (x, y, z, t) are exhibited in the four-dimensional mode.

After the multi-dimensional geological survey guarantee system is constructed, the complete basic geological survey information and the results of data processing and analysis in the multi-dimensional geological survey guarantee system are used as the basis for the storage and the exhibition of the mine intelligent management and control platform, wherein the complete basic geological survey information refers to geological data and measurement data having multi-dimensional geographic coordinates. The geological data refer to survey data including coal bed, terrane, aquiclude, mine pressure and gas, geological structure and results of working-face coal-terrane identification that are acquired by exploratory boring, geophysical prospecting, chemical exploration and laneway sketching. The measurement data refer to surveying-and-mapping data of earth surface, laneway, working face and goaf that are formed by engineering construction in a process of mine construction. The results of data processing and analysis refer to morphologies and characteristics of coal bed or stratum and conditions of spatial distribution of laneway, geological reserve, construction, hydrology, gas, mine pressure and rock-or-stratum physical-property parameter that are obtained by processing and professional analysis on the basic geological survey information.

The visual operation interface displays the complete basic geological survey information and the results of data processing and analysis on a screen by using the GIS or CAD technique, and is capable of operating the displayed interface. A mode of the visualization includes a two-dimensional mode, a three-dimensional mode and a four-dimensional mode, and the operating refers to interaction with the multi-dimensional basic geological survey information and the results of data processing and analysis in the visual interface by using a mouse, a keyboard, screen touching and voice controlling.

In an embodiment of the present disclosure, the multi-source geological survey data include: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological-survey realistic data, rock-or-stratum physical-property-parameter data, coal-terrane-identification data, and special-subject graphic data including results of disaster analysis on geological structure, hydrology and gas. The geological-guarantee function includes: storing, exhibiting, inquiring and operating spatial distribution of laneways, coal beds and other stratums, and an abnormal region and an abnormal value, and exhibiting essential information and abnormal information of stope faces and driving working faces, wherein the abnormal region refers to a region where mine pressure, gas or hydrology is abnormal or a region where a coal bed is provided with a characteristic of spontaneous combustion. Likewise, the above description merely illustratively describes some of the functions of the multi-source geological survey data and the geological survey guaranteeing, and does not mean that the mine intelligent management and control platform merely has these functions of geological survey information and geological survey guaranteeing.

In addition, the multi-dimensional geological survey guarantee system is provided with basic features including a system-architecture-mode feature, an essential-information-exhibition feature, and a time-space analysis-and-application feature.

The system-architecture-mode feature refers to that an architecture of the multi-dimensional geological survey guarantee system supports architectures of B/S and C/S, and satisfies a mode of cloud deployment.

The essential-information-exhibition feature refers to that the multi-dimensional geological survey guarantee system realizes visual exhibition of the multi-source geological survey data, particularly including: coal-bed information, drilling information, fault information, laneway information, pools-zone information, goaf information, collapse-column information, and abnormal-region information, and a mode of the exhibition includes a two-dimensional mode, a three-dimensional mode and a four-dimensional mode.

The time-space analysis-and-application feature refers to that the multi-dimensional geological survey guarantee system performs visual exhibition and inquiring of abnormal regions and abnormal values of mine pressure, gas, hydrology, and characteristic of spontaneous combustion of coal bed, exhibits essential information and abnormal information of stope faces and driving working faces, and is capable of exhibiting coal-mine stratum, geological structure, coal bed, coal quality, gas, hydrogeology and other geological conditions, geological features and change rules based on a geological survey model and an engineering-data model. The multi-dimensional geological survey guarantee system is provided with relevant geological-survey-guaranteeing-type functions of high-precision geological modeling, laneway modeling, transparent working face, three-dimensional-space-information analysis and historical-data consulting, and hidden-disaster-causing analysis, wherein the hidden-disaster-causing analysis refers to performing predicting and warning analysis on mine hazard sources and disaster data.

step 103: based on the GIS or CAD technique, according to engineering exploration and production variation, realizing dynamic construction and automatic updating based on the multi-dimensional visual geological survey data in the multi-dimensional geological survey guarantee system.

In an embodiment of the present disclosure, the accuracies of multi-source geological survey data may be high or low. In order to ensure the accuracies of the multi-source geological survey data, the dynamic construction and the automatic updating of the data may be performed by referring to engineering exploration and production variation, to increase the accuracies of the multi-source geological survey data. The data of engineering exploration and production variation include: special-subject graphics drawn based on various types of GIS or CAD.

Firstly, it is required to perform unified processing to the data of engineering exploration and production variation. Therefore, after receiving the graphics, a visualization software is used to perform data processing to the graphics. The data processing includes performing unified processing based on the unified GIS or CAD standard; and subsequently, based on the graphic or model result formed after the unified processing, performing dynamic construction to the multi-dimensional visual geological survey data in the multi-dimensional geological survey guarantee system, wherein the dynamic construction includes: performing high-precision modeling to geological bodies including a coal bed, a drilled hole, a fault, a laneway, a pools zone, a goaf and a collapse column, and verifying and correcting existing multi-source geological survey data or newly establishing non-existing multi-source geological survey data.

In addition, in the process of mine exploitation, the multi-source geological survey data definitely change to a certain extent with the proceeding of the exploitation. Therefore, it is further required to perform automatic updating of the multi-dimensional visual geological survey data in the multi-dimensional geological survey guarantee system according to data changing along with mining and exploration. That facilitates the analysis and prediction of hazard sources or disasters and the analysis, decision making and management on the data of safe production and operation in the future.

The embodiments of the present disclosure merely illustratively describe the GIS system and the CAD system, which does not mean that the mine intelligent management and control platform can merely perform dynamic construction and automatic updating based on these GIS system and CAD system.

step 104: by using the multi-dimensional geological survey guarantee system as a base, constructing and accessing scenes and data of different types of safe-production systems in the mine intelligent management and control platform, to further realize visualized patrolling inspection, digital twinning and remote industrial control.

In an embodiment of the present disclosure, the mine intelligent management and control platform is further required to be provided with intelligent control on safe production. Therefore, it is required to construct and access scenes of different types of safe-production systems. In view of that, the mine intelligent management and control platform is required to realize visualized patrolling inspection, digital twinning and remote industrial control.

The process includes, firstly, performing delicate modeling of the scenes of the different types of safe-production systems by three-dimensional modeling, to obtain three-dimensional models corresponding to the scenes of the different types of safe-production systems; subsequently, accessing real-time operation states of the different types of safe-production systems in the scenes of the different types of safe-production systems into the three-dimensional models, to realize the digital twinning; subsequently, in the scenes of the different types of safe-production systems, simulating a personnel-in-well-patrolling-inspection path, to realize personnel in-well patrolling inspection in a virtual environment, patrolling-inspecting whether an abnormality exists in the scenes of the different types of safe-production systems, and generating a corresponding patrolling-inspecting report, to realize the visualized patrolling inspection; and, finally, accessing manipulating instructions of the different types of safe-production systems into the three-dimensional models, and by remote instruction dispatching, realizing the remote industrial control, including providing cutting-line geological information to excavation equipment, to realize deep coupling and action of the excavation equipment and the geological model.

It should be noted that the remote industrial control is mainly used for comprehensive automation-type systems in different types of systems for safe production and operation, to realize remote control on single apparatus, single system and multiple systems in the well. The remote industrial control is capable to flexibly select a single system and production line to be controlled, and regarding a production-line system, it is capable to realize cooperative controlling on the apparatuses of different steps to perform an overall safety detection before starting up, including the apparatus operation states, the remote-controlling conditions, the warning messages and so on. All apparatuses of the entire production system may be started up in order by using a starting-up button if they meet the starting-up conditions If all apparatuses meet the starting-up conditions.

In an embodiment of the present disclosure, the different types of safe-production systems include: a monitor-type system, a comprehensive automation-and-intellectualization-type system and a safe-production-and-operation business management system.

The monitor-type system includes: mine monitoring systems including safety monitoring, personnel-position monitoring, industrial video monitoring, mine-pressure monitoring, rock-burst monitoring, beam-tube monitoring, hydrogeology monitoring, gas extraction, side-slope monitoring, and road maintenance and monitoring.

The comprehensive automation-and-intellectualization-type system includes: comprehensive automation systems including coal mining, excavation, main-coal-flow transportation, water supplying and draining, ventilation, wind-suppression self-aid, electric-power supplying, coal bunker, auxiliary transportation management, well-vertical-movement drone, unmanned truck, rotating-bucket-excavator monitoring, reversed-loader monitoring, dumping-plough monitoring and dragline-shovel-electrical system.

The safe-production-and-operation business management system includes: business systems including production-technique management, production-dispatching management, One-Ventilation-and-Three-Prevention management, safety management, geological survey water-preventing-and-treating management, mechanical and electric management, energy conservation and environment protection, and selling.

step 105: according to the multi-dimensional geological survey guarantee system, fusing the multi-source geological survey data and the business system data of safe production and operation, to obtain analysis, decision making and visual exhibition of data of hidden disaster causing and safe production and operation.

In an embodiment of the present disclosure, after completing the preceding steps 101-104, this step may include, in the process of the mine production, according to the multi-dimensional geological survey guarantee system, by referring to the multi-source geological survey data and the data of the different types of business systems for safe production and operation that are fused, obtaining results of data analysis of hidden disaster causing and safe production and operation, and performing visual exhibition.

This step may particularly include: based on the multi-dimensional geological survey guarantee system, fusing the multi-source geological survey data and the business system data of safe production and operation, by using a predicting model and a decision making model, processing real-time production data, obtaining results of data analysis of hidden disaster causing and safe production and operation, and performing visual exhibition, so that the mine intelligent management and control platform may be provided with functions of predicting and warning of hidden disaster causing, intelligent controlling, patrolling inspecting, safe-production-situation analysis, production-operation decision-making analysis and visual exhibition, thereby realizing the integration of the "monitoring, controlling, decision making and management" of full-mine safe production. The predicting and warning of hidden disaster causing refers to exhibition of predicting and warning realized by using the predicting model of data of geological hazards and hazard sources in the geological survey guarantee system serving as the base.

Figure 2:
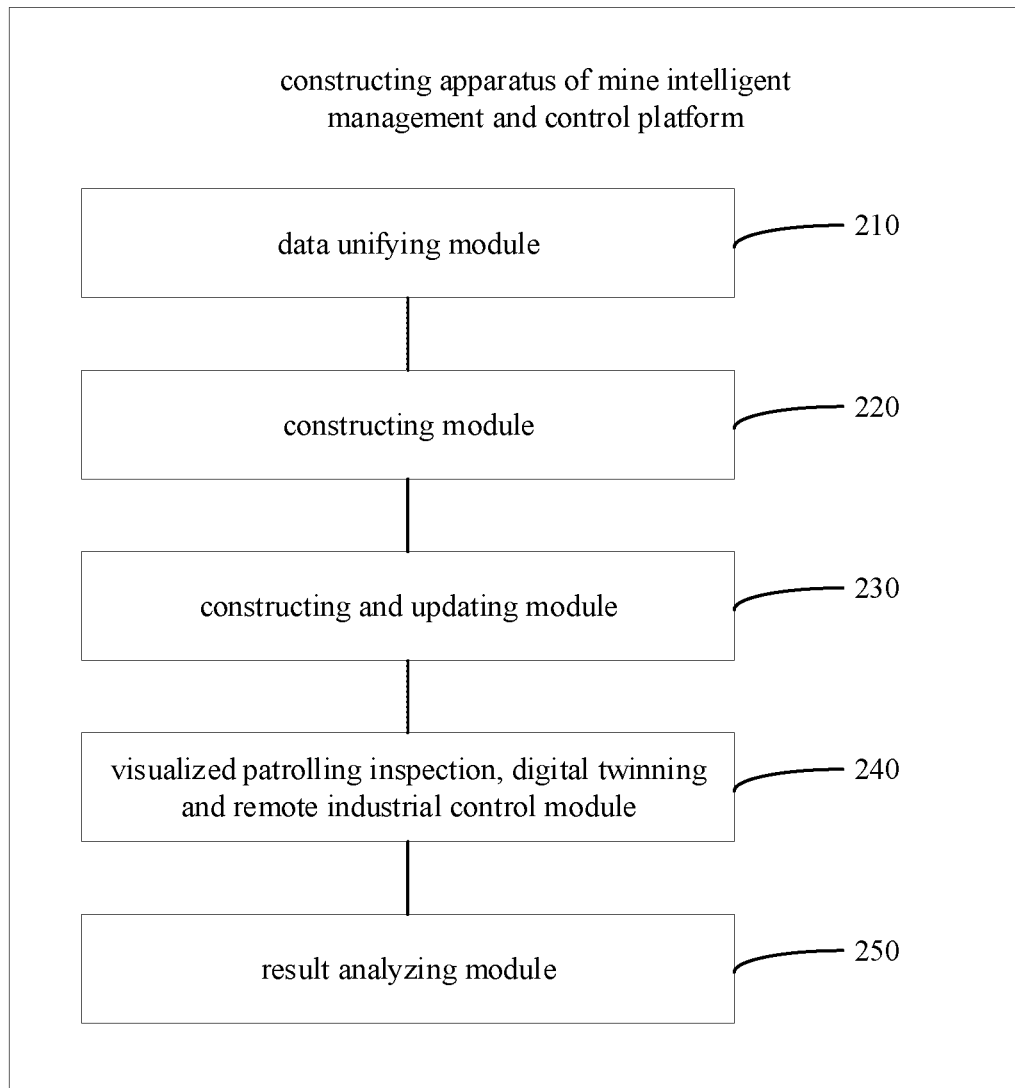
FIG. 2 is a block diagram of the apparatus for constructing an mine intelligent management and control platform based on a geological survey guarantee system according to an embodiment of the present disclosure.

In an embodiment of the present disclosure, based on the above method for constructing an mine intelligent management and control platform based on a geological survey guarantee system, there is further provided an apparatus for constructing an mine intelligent management and control platform based on a geological survey guarantee system. Referring to FIG. 2, FIG. 2 shows a block diagram of the apparatus for constructing an mine intelligent management and control platform based on a geological survey guarantee system according to an embodiment of the present disclosure. The apparatus for constructing an mine intelligent management and control platform includes:

a data unifying module 210 configured for, establishing a unified data standard, and constructing a unified data center including multi-source geological survey data and business system data of safe production and operation, to realize unified storage and management of data;

a constructing module 220 configured for constructing a multi-dimensional (x, y), (x, y, t), (x, y, z) and (x, y, z, t) geological survey guarantee system which uses the unified data center as a data source, to provide a basic platform and a visual management and control interface to the mine intelligent management and control platform;

a constructing and updating module 230 configured for, based on the GIS or CAD technique, realizing dynamic construction and automatic updating based on the multi-dimensional visual geological survey data in the multi-dimensional geological survey guarantee system according to engineering exploration and production variation;

a visualized patrolling inspection, digital twinning and remote industrial control module 240 configured for, by using the multi-dimensional geological survey guarantee system as a base, constructing and accessing scenes and data of different types of safe-production systems in the mine intelligent management and control platform, to further realize visualized patrolling inspection, digital twinning and remote industrial control; and a result analyzing module 250 configured for, according to the multi-dimensional geological survey guarantee system, fusing the multi-source geological survey data and the business system data of safe production and operation, to obtain analysis, decision making and visual exhibition of data of hidden disaster causing and safe production and operation, to realize the construction of the mine intelligent management and control platform based on the multi-dimensional geological survey guarantee system.

Optionally, the unified data standard includes: a unified master-data standard, a unified data-interface standard, a unified GIS or CAD standard and a unified hardware-system data-interface standard; and the data unifying module 210 is particularly configured for:

for the multi-source geological survey data and the business system data of safe production and operation, determining the types of the master data that are required to be integrated into the data center according to the unified data-interface standard;

according to the types of the master data and the unified master-data standard, performing a data unifying operation to the master data, to define identification marks of different types of the master data, wherein different identification marks represent different types of the master data; and for GIS information or CAD information contained in the multi-source geological survey data and the business system data of safe production and operation, performing unified processing according to the unified GIS or CAD standard, to obtain corresponding and unified geographic coordinates;

wherein the multi-source geological survey data include: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological-survey realistic data, rock-or-stratum physical-property-parameter data, coal-terrane-identification data, and special-subject graphic data including results of disaster analysis on geological structure, hydrology and gas; and the business system data of safe production and operation include: risk-management and control data, hidden-trouble-investigation data, safe-production-standardization data, three-violation-management data, weak-personnel-management data, emergency-rescue data, comprehensive-dispatching data, production-management data, electro-mechanical-transportation data, One-Ventilation-and-Three-Prevention data, monitoring data, excavation data, comprehensive-automation-and-intellectualization data, and special-subject graphic data other than geological survey and so on.

Optionally, the multi-source geological survey data include: geological survey information that reflects a geographic-coordinate location and is provided with a multi-dimensional geographic-coordinate feature;

the multi-source geological survey data are basic geographical and space-time information for ensuring normal exploitation of a mine, and it is provided with a multi-dimensional geographic-coordinate feature, and with data-presentation forms including (x, y), (x, y, t), (x, y, z) and (x, y, z, t), wherein t represents time information;

the constructing module 220 is particularly configured for:

based on the multi-dimensional geographic-coordinate feature, by using the unified GIS or CAD standard and a geological modeling model, constructing the multi-dimensional geological survey guarantee system, so that the mine intelligent management and control platform performs visual exhibition of the multi-source geological survey data, wherein the visual exhibition exhibits in a two-dimensional, a three-dimensional or a four-dimensional mode;

In the construction of the basic mine intelligent management and control platform, the basic platform uses complete basic geological survey information and the results of data processing and analysis in the multi-dimensional geological survey guarantee system as a basis for storage and exhibition of the mine intelligent management and control platform, wherein the complete basic geological survey information refers to geological data and measurement data having multi-dimensional geographic coordinates, the geological data refer to survey data including coal bed, terrane, aquiclude, mine pressure and gas, geological structure and results of working-face coal-terrane identification that are acquired by exploratory boring, geophysical prospecting, chemical exploration and laneway sketching; the measurement data refer to surveying-and-mapping data of earth surface, laneway, working face and goaf that are formed by engineering construction in a process of mine construction; the geological data refer to objectively existing data including coal bed, terrane, aquiclude, mine pressure and gas and geological structure that are acquired by exploratory boring, geophysical prospecting, chemical exploration and so on; the measurement data refer to measurement data of laneway, working face, goaf and coal-terrane identification that are formed by engineering construction in a process of mine construction; the results of data processing and analysis refer to morphologies and characteristics of coal bed or stratum and conditions of spatial distribution of laneway, geological reserve, construction, hydrology, gas, mine pressure and rock-or-stratum physical-property parameter that are obtained by processing and professional analysis on the basic geological survey information.

The visual operation interface displays the complete basic geological survey information and the results of data processing and analysis on a screen by using the GIS or CAD technique, and is capable of operating the displayed interface; a mode of the visualization includes a two-dimensional mode, a three-dimensional mode and a four-dimensional mode, and the operating refers to interaction with the multi-dimensional basic geological survey information and the results of data processing and analysis in the visual interface by using a mouse, a keyboard, screen touching and voice controlling; and performing data fusion between the data of the unified data center and the multi-dimensional geological survey guarantee system, so that the mine intelligent management and control platform provides a visual management and control interface to the mine intelligent management and control platform based on the visual exhibition of the multi-source geological survey data;

The multi-source geological survey data include: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological-survey realistic data, rock-or-stratum physical-property-parameter data, coal-terrane-identification data, and special-subject graphic data including results of disaster analysis on geological structure, hydrology, gas, spontaneous combustion of coal bed and mine ground pressure;

The geological-guarantee function includes: storing, exhibiting, inquiring and operating spatial distribution of laneways, coal beds and other stratums, and an abnormal region and an abnormal value, and exhibiting essential information and abnormal information of stope faces and driving working faces, wherein the abnormal region refers to a region where mine pressure, gas or hydrology is abnormal or a region where a coal bed has a characteristic of spontaneous combustion;

The multi-dimensional geological survey guarantee system should be provided with basic features including a system-architecture-mode feature, an essential-information-exhibition feature, and a time-space analysis-and-application feature;

The system-architecture-mode feature refers to that an architecture of the multi-dimensional geological survey guarantee system supports architectures of B/S and C/S, and satisfies a mode of cloud deployment;

The essential-information-exhibition feature refers to that the multi-dimensional geological survey guarantee system realizes visual exhibition of the multi-source geological survey data, particularly including: coal-bed information, coal-bed-spontaneous-combustion feature information, drilling information, fault information, laneway information, pools-zone information, goaf information, collapse-column information, and gas-and-mine-pressure abnormal-region information, and a mode of the exhibition includes a two-dimensional mode, a three-dimensional mode and a four-dimensional mode;

The time-space analysis-and-application feature refers to that the multi-dimensional geological survey guarantee system performs visual exhibition and inquiring of abnormal regions and abnormal values of mine pressure, gas, hydrology, and characteristic of spontaneous combustion of coal bed, exhibits essential information and abnormal information of stope faces and driving working faces, and is capable of, exhibiting coal-mine stratum, geological structure, coal bed, coal quality, gas, hydrogeology and other geological conditions, geological features and change rules based on a geological survey model and an engineering-data model; and the multi-dimensional geological survey guarantee system is provided with relevant geological-survey-guaranteeing-type functions of high-precision geological modeling, laneway modeling, transparent working face, three-dimensional-space-information analysis and historical-data consulting, and hidden-disaster-causing analysis, wherein the hidden-disaster-causing analysis refers to performing predicting and warning analysis on mine hazard sources and disaster data.

Optionally, the data of engineering exploration and production variation include: special-subject graphics drawn based on various types of GIS or CAD; and the constructing and updating module 230 is particularly configured for:

receiving the graphics or geological-survey-description information, and by using a visualization software, performing data processing to the graphics or geological-survey-description information, wherein the data processing includes performing unified processing based on the unified GIS or CAD standard, to convert and process coordinates in the graphics into corresponding and unified geographic coordinates, and obtain a graphic or model result at the same time;

based on the graphic or model result formed after the unified processing, performing dynamic construction to the multi-dimensional visual geological survey data in the multi-dimensional geological survey guarantee system, wherein the dynamic construction includes: performing high-precision modeling to geological bodies including a coal bed, a drilled hole, a fault, a laneway, a pools zone, a goaf and a collapse column, and verifying and correcting existing geological survey information or newly establishing non-existing geological survey information; and according to data changing caused by exploration along with exploitation, exploration along with excavation and production variation, further according to the unified data standard, realizing data processing and storing and entering into the data center, by using a function of automatic updating of geological bodies and laneway engineering, performing automatic updating of the multi-dimensional visual geological survey data in the multi-dimensional geological survey guarantee system.

Optionally, the visualized patrolling inspection, digital twinning and remote industrial control module 240 is particularly configured for:

performing delicate modeling of the scenes of the different types of safe-production systems by three-dimensional modeling, to obtain three-dimensional models corresponding to the scenes of the different types of safe-production systems;

accessing real-time operation states of the different types of safe-production systems in the scenes of the different types of safe-production systems into the three-dimensional models, to realize the digital twinning;

in the scenes of the different types of safe-production systems, simulating a personnel-in-well-patrolling-inspection path, to realize personnel in-well patrolling inspection in a virtual environment, patrolling-inspecting whether an abnormality exists in the scenes of the different types of safe-production systems, and generating a corresponding patrolling-inspecting report, to realize the visualized patrolling inspection; and accessing manipulating instructions of the different types of safe-production systems into the three-dimensional models, and by remote instruction dispatching, realizing the remote industrial control, including providing cutting-line geological information to excavation equipment, to realize deep coupling and action of the excavation equipment and the geological model;

wherein the different types of safe-production systems include: a monitor-type system, a comprehensive automation-and-intellectualization-type system and a safe-production-and-operation business managing system;

the monitor-type system includes: mine monitoring systems including safety monitoring, personnel-position monitoring, industrial video monitoring, mine-pressure monitoring, rock-burst monitoring, beam-tube monitoring, hydrogeology monitoring, gas extraction, side-slope monitoring, and road maintenance and monitoring;

the comprehensive automation-and-intellectualization-type system includes: comprehensive automation systems including coal mining, excavation, main-coal-flow transportation, water supplying and draining, ventilation, wind-suppression self-aid, electric-power supplying, coal bunker, auxiliary transportation management, well-vertical-movement drone, unmanned truck, rotating-bucket-excavator monitoring, reversed-loader monitoring, dumping-plough monitoring and dragline-shovel-electrical system; and the safe-production-and-operation business managing system includes: business systems including production-technique management, production-dispatching management, One-Ventilation-and-Three-Prevention management, safety management, geological survey water-preventing-and-treating management, mechanical and electric management, energy conservation and environment protection, and selling.

Optionally, the result analyzing module 250 is particularly configured for:

based on the multi-dimensional geological survey guarantee system, fusing the multi-source geological survey data and the business system data of safe production and operation, by using a predicting model and a decision making model, processing real-time production data, obtaining results of data analysis of hidden disaster causing and safe production and operation, and performing visual exhibition, so that the mine intelligent management and control platform has functions of predicting and warning of hidden disaster causing, intelligent controlling, patrolling inspecting, safe-production-situation analysis, production-operation decision-making analysis and visual exhibition; and wherein the predicting and warning of hidden disaster causing refers to exhibition of predicting and warning realized by using the predicting model of data of geological hazards and hazard sources in the geological survey guarantee system serving as the base.

In conclusion, the method for constructing an mine intelligent management and control platform according to the present disclosure includes, firstly, establishing a unified data standard, and constructing a unified data center including multi-source geological survey data and business system data of safe production and operation, to realize unified storage and management of data, so that the multi-source geological survey data and the business system data of safe production and operation are stored and managed in a unified mode. Accordingly, the data that were previously separate are unified to the data center, which lays a good basis for the analysis and prediction of hidden hazard sources or disasters and the analysis, decision making and management on the business data of safe production and operation in the process of the mine exploitation by the mine intelligent management and control platform.

After the data unifying, the method further includes constructing a multi-dimensional (x, y), (x, y, t), (x, y, z) and (x, y, z, t) geological survey guarantee system using the unified data center as a data source, to provide a visual management and control interface to the mine intelligent management and control platform. Such a mode does not only realize that the multi-dimensional geological survey guarantee system has geographic coordinates, but also integrates all of the data of the unified data center into the multi-dimensional geological survey guarantee system, which provides the frame and the base for the mine intelligent management and control platform, and lays a good basis for realizing the daily management, controlling, data analysis and decision making of mine exploitation in future in the geographic environment in a more intuitive way.

After the multi-dimensional geological survey guarantee system has been constructed, the method may further include, based on the GIS or CAD technique, according to engineering exploration and production variation, realizing dynamic construction and automatic updating based on the multi-dimensional visual geological survey data in the multi-dimensional geological survey guarantee system. That does not only ensure the visual exhibition of the latest geological survey information by the mine intelligent management and control platform, but also facilitates the analysis and prediction of hazard sources or disasters and the analysis, decision making and management on the data of safe production and operation in future.

Considering the safety factors, by using the multi-dimensional geological survey guarantee system as a base, constructing and accessing scenes and data of different types of safe-production systems in the mine intelligent management and control platform, to realize visualized patrolling inspection, digital twinning and remote industrial control, and to realize remote industrial control in the geographic environment.

Finally, according to the multi-dimensional geological survey guarantee system, fusing the multi-source geological survey data and the business system data of safe production and operation, obtaining results of data analysis of hidden disaster causing and safe production and operation, and performing visual exhibition. The method realizes deep fusion of multi-source geological-disaster-type data, fully considers the feasibility of intelligent management and control using the multi-dimensional geological survey guarantee system as the base, performs comprehensive analysis and decision making to the overall process of mine exploitation including the factors of hidden disaster causing and disasters, realizes a new model of intelligent mine management and control with the geological survey multidimensional data as the basis, finally realizes the construction of the mine intelligent management and control platform based on the geological survey guarantee system, satisfies the overall requirements on intelligent and environmentally friendly mines, and satisfies the policy orientation of intelligent mine construction.

Although preferable embodiments of the embodiments of the present disclosure have been described, once a person skilled in the art has known the essential inventive concept, he may make further variations and modifications on these embodiments. Therefore, the appended claims are intended to be interpreted as including the preferable embodiments and all of the variations and modifications that fall within the scope of the embodiments of the present disclosure.

Finally, it should also be noted that, in the present text, relation terms such as first and second are merely intended to distinguish one entity or operation from another entity or operation, and that does not necessarily require or imply that these entities or operations have therebetween any such actual relation or order. Furthermore, the terms "include", "include" or any variants thereof are intended to cover non-exclusive inclusions, so that processes, methods, articles or terminal devices that include a series of elements do not only include these elements, but also include other elements that are not explicitly listed, or include the elements that are inherent to such processes, methods, articles or terminal devices. Unless further limitation is set forth, an element defined by the wording "including a . . . " does not exclude additional same element in the process, method, article or terminal device including the element.

The embodiments of the present disclosure are described above with reference to the drawings. However, the present disclosure is not limited to the above particular embodiments. The above particular embodiments are merely illustrative, rather than limitative. A person skilled in the art, under the motivation of the present disclosure, can make many variations without departing from the spirit of the present disclosure and the protection scope of the claims, and all of the variations fall within the protection scope of the present disclosure.

The invention claimed is:

1. A construction method of an advanced mine intelligent management and control platform based on a geological survey guarantee system, wherein the construction method comprises steps of:
   step 1: establishing a unified data standard, and constructing a unified data center comprising multi-source geological survey data and business system data of safe production and operation, to implement unified storage and management of data;
   step 2: constructing a multi-dimensional (x, y), (x, y, t), (x, y, z) and (x, y, z, t) geological survey guarantee system which uses the unified data center as a data source based on a geographic information system (GIS) or computer-aided design (CAD) technique and system, to complete construction of a basic mine intelligent management and control platform and a visual operation interface;
   step 3: according to engineering exploration and production variation, performing dynamic construction and automatic updating based on multi-dimensional visual geological survey data in the multi-dimensional geological survey guarantee system;
   step 4: by using the multi-dimensional geological survey guarantee system as a base, constructing and accessing scenes and data of different types of safe-production systems in the basic mine intelligent management and control platform, to implement visualized patrolling inspection, digital twinning and remote industrial control; and step 5: according to the multi-dimensional geological survey guarantee system, performing fusion of the multi-source geological survey data and the business system data of safe production and operation, and analysis, decision making and visual exhibition of data of hidden disaster causing and safe production and operation, to form the advanced mine intelligent management and control platform by using the multi-dimensional geological survey guarantee system as the base;

wherein the multi-source geological survey data comprise: geological survey information that reflects a geographic-coordinate location and is provided with a multi-dimensional geographic-coordinate feature;

the multi-source geological survey data are basic geographical and space-time information for ensuring normal exploitation of a mine, and is provided with a multi-dimensional geographic-coordinate feature, and with data-presentation forms comprising (x, y), (x, y, t), (x, y, z) and (x, y, z, t);

the geographic-coordinate location is a spatial position that is capable of reflecting a location of a geological body, and describes a spatial position between the geological body and a laneway and a working face by using a coordinate system, and in the multi-dimensional (x, y), (x, y, t), (x, y, z) and (x, y, z, t) geological survey guarantee system, x represents a horizontal coordinate describing the geological body based on the coordinate system, y represents a vertical coordinate describing the geological body based on the coordinate system, and z represents an attribute value comprising an elevation or a stratum thickness describing the geological body based on the coordinate system, wherein t represents time information;

the step of constructing the multi-dimensional (x, y), (x, y, t), (x, y, z) and (x, y, z, t) geological survey guarantee system which uses the unified data center as the data source, to construct the basic mine intelligent management and control platform comprises:

based on the multi-dimensional geographic-coordinate feature, designing and constructing the multi-dimensional geological survey guarantee system by using the GIS or the CAD technique and system, wherein the multi-dimensional geological survey guarantee system exhibits in a two-dimensional, three-dimensional or four-dimensional mode;

in the construction of the basic mine intelligent management and control platform, the basic platform uses complete basic geological survey information and results of data processing and analysis in the multi-dimensional geological survey guarantee system as a basis for storage and exhibition of the basic mine intelligent management and control platform, wherein the complete basic geological survey information refers to geological data and measurement data having multi-dimensional geographic coordinates, the geological data refer to survey data including coal bed, terrane, aquiclude, mine pressure and gas, geological structure and results of working-face coal-terrane identification that are acquired by exploratory boring, geophysical prospecting, chemical exploration and laneway sketching;

the measurement data refer to surveying-and-mapping data of earth surface, laneway, working face and goaf that are formed by engineering construction in a process of mine construction;

the results of data processing and analysis refer to morphologies and characteristics of coal bed or stratum and conditions of spatial distribution of laneway, geological reserve, construction, hydrology, gas, mine pressure and rock-or-stratum physical-property parameter that are obtained by processing and professional analysis on the basic geological survey information;

the visual operation interface displays the complete basic geological survey information and the results of data processing and analysis on a screen by using the GIS or CAD technique, and is capable of operating a displayed interface;

a mode of a visualization comprises a two-dimensional mode, a three-dimensional mode and a four-dimensional mode, and the operating refers to interaction with the multi-dimensional basic geological survey information and the results of data processing and analysis in the visual interface by using a mouse, a keyboard, screen touching and voice controlling;

a geological-guarantee function comprises: storing, exhibiting, inquiring and operating spatial distribution of laneways, coal beds and other stratums, and an abnormal region and an abnormal value, and exhibiting essential information and abnormal information of stope faces and driving working faces, wherein the abnormal region refers to a region where mine pressure, gas or hydrology is abnormal or a region where a coal bed is provided with a characteristic of spontaneous combustion;

the multi-dimensional geological survey guarantee system is provided with basic features comprising a system-architecture-mode feature, an essential-information-exhibition feature, and a time-space analysis-and-application feature;

the system-architecture-mode feature refers to that an architecture of the multi-dimensional geological survey guarantee system supports architectures of B/S and C/S, and satisfies a mode of cloud deployment;

the essential-information-exhibition feature refers to that the multi-dimensional geological survey guarantee system implements visual exhibition of the multi-source geological survey data, comprising: coal-bed information, coal-bed-spontaneous-combustion feature information, drilling information, fault information, laneway information, pools-zone information, goaf information, collapse-column information, and gas-and-mine-pressure abnormal-region information, and a mode of the exhibition comprises a two-dimensional mode, a three-dimensional mode and a four-dimensional mode;

the time-space analysis-and-application feature refers to that the multi-dimensional geological survey guarantee system performs visual exhibition and inquiring of abnormal regions and abnormal values of mine pressure, gas, hydrology, and characteristic of spontaneous combustion of coal bed, exhibits the essential information and the abnormal information of the stope faces and the driving working faces, and is capable of exhibiting coal-mine stratum, geological structure, coal bed, coal quality, gas, hydrogeology and other geological conditions, geological features and change rules based on a geological survey model and an engineering-data model; and the multi-dimensional geological survey guarantee system is provided with relevant geological-survey-guarantee-type functions of high-precision geological modeling, transparent working face, three-dimensional-space-information analysis and historical-data consulting, and hidden-disaster-causing analysis, wherein the hidden-disaster-causing analysis refers to performing predicting and warning analysis on mine hazard sources and disaster data.

2. The construction method of the advanced mine intelligent management and control platform according to claim 1, wherein the unified data standard comprises: a unified master-data standard, a unified data-interface standard, a unified GIS or CAD standard and a unified hardware-system data-interface standard; and the step of constructing the unified data center comprising the multi-source geological survey data and the business system data of safe production and operation comprises:

for the multi-source geological survey data and the business system data of safe production and operation, determining types of master data that are required to be integrated into the basic mine intelligent management and control platform according to the unified data-interface standard;

according to the types of the master data and the unified master-data standard, performing a data unifying operation to the master data, to define identification marks of different types of the master data, wherein different identification marks represent different types of the master data; and for GIS information or CAD information comprised in the multi-source geological survey data and the business system data of safe production and operation, performing unified processing according to the unified GIS or CAD standard, to obtain corresponding and unified geographic coordinates;

wherein the multi-source geological survey data comprise: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological realistic data, rock-or-stratum physical-property-parameter data, coal-terrane-identification data, and special-subject graphic data comprising results of disaster analysis on geological structure, hydrology, gas, spontaneous combustion of coal bed and mine ground pressure; and the business system data of safe production and operation comprise: risk-management and control data, hidden-trouble-investigation data, safe-production-standardization data, three-violation-management data, weak-personnel-management data, emergency-rescue data, comprehensive-dispatching data, production-management data, electro-mechanical-transportation data, One-Ventilation-and-Three-Prevention data, monitoring data, excavation data, comprehensive-automation-and-intellectualization data, and special-subject graphic data other than geological survey.

3. The construction method of the advanced mine intelligent management and control platform according to claim 2, wherein data of engineering exploration and production variation comprise: multi-dimensional graphics or models processed based on the GIS or CAD system; and the step of, based on the GIS or CAD technique, according to engineering exploration and production variation, performing dynamic construction and automatic updating based on the multi-dimensional visual geological survey data in the multi-dimensional geological survey guarantee system comprises:

receiving the graphics or geological-survey-description information, and, performing data processing to the graphics or geological-survey-description information by using a visualization software, wherein the data processing comprises performing unified processing based on the unified GIS or CAD standard, to convert and process coordinates in the graphics into corresponding and unified geographic coordinates, and to obtain a graphic or model result;

based on the graphic or model result formed after the unified processing, performing dynamic construction to the multi-dimensional visual geological data in the multi-dimensional geological survey guarantee system, wherein the dynamic construction comprises: performing high-precision modeling to geological bodies comprising a coal bed, a drilled hole, a fault, a laneway, a pools zone, a goaf and a collapse column, and verifying and correcting existing geological survey information or newly establishing non-existing geological survey information; and performing data processing, storing and entering into the data center according to data changing along with mining and exploration, and the unified data standard, and performing automatic updating of the multi-dimensional visual geological survey data in the multi-dimensional geological survey guarantee system by using a function of automatic updating of geological bodies and laneway engineering.

4. The construction method of the advanced mine intelligent management and control platform according to claim 3, wherein the step of, by using the multi-dimensional geological survey guarantee system as the base, constructing and accessing the scenes and data of different types of safe-production systems in the basic mine intelligent management and control platform, to implement the visualized patrolling inspection, the digital twinning and the remote industrial control comprises:

constructing and accessing the scenes and data of different types of safe-production systems in the basic mine intelligent management and control platform by using the multi-dimensional geological survey guarantee system as the base, wherein by using the multi-dimensional geological survey guarantee system as the base is a basis and support of the basic mine intelligent management and control platform, by using the complete basic geological survey information, providing multi-dimensional geographic coordinates of application scenes of subsystems of the basic mine intelligent management and control platform, providing a visual basic manipulating interface for the basic mine intelligent management and control platform, and carrying the visualized patrolling inspection, the digital twinning and the remote industrial control of the subsystems;

performing delicate modeling of the scenes of the different types of safe-production systems by three-dimensional modeling, to obtain three-dimensional models of the scenes of the different types of safe-production systems;

accessing real-time operation states of the different types of safe-production systems in the scenes of the different types of safe-production systems into the three-dimensional models, to implement the digital twinning;

in the scenes of the different types of safe-production systems, simulating a personnel-in-well-patrolling-inspection path, to implement personnel in-well patrolling inspection in a virtual environment, patrolling-inspecting whether an abnormality exists in the scenes of the different types of safe-production systems, and generating a corresponding patrolling-inspecting report, to implement the visualized patrolling inspection; and accessing manipulating instructions of the different types of safe-production systems into the three-dimensional models, and by remote instruction dispatching, performing the remote industrial control, comprising providing cutting-line geological information to excavation equipment, to implement deep coupling and action of the excavation equipment and a geological model;

wherein the different types of safe-production systems comprise: a monitor-type system, a comprehensive automation-and-intellectualization-type system and a safe-production-and-operation business managing system;

the monitor-type system comprises: mine monitoring systems comprising safety monitoring, personnel-position monitoring, industrial video monitoring, mine-pressure monitoring, rock-burst monitoring, beam-tube monitoring, hydrogeology monitoring, gas extraction, side-slope monitoring, and road maintenance and monitoring;

the comprehensive automation-and-intellectualization-type system comprises: comprehensive automation systems comprising coal mining, excavation, main-coal-flow transportation, water supplying and draining, ventilation, wind-suppression self-aid, electric-power supplying, coal bunker, auxiliary transportation management, well-vertical-movement drone, unmanned truck, rotating-bucket-excavator monitoring, reversed-loader monitoring, dumping-plough monitoring and a dragline-shovel-electrical system; and the safe-production-and-operation business managing system comprises: business systems comprising production-technique management, production-dispatching management, One-Ventilation-and-Three-Prevention management, safety management, geological survey water-preventing-and-treating management, mechanical and electric management, energy conservation and environment protection, and selling.

5. The construction method of the advanced mine intelligent management and control platform according to claim 4, wherein the step of, according to the multi-dimensional geological survey guarantee system, performing the fusion of the multi-source geological survey data and the business system data of safe production and operation, and analysis, decision making and visual exhibition of the data of hidden disaster causing and safe production and operation, to form the advanced mine intelligent management and control platform based on the multi-dimensional geological survey guarantee system as the base comprises:

based on the multi-dimensional geological survey guarantee system, fusing the multi-source geological survey data and the business system data of safe production and operation, by using a predicting model and a decision making model, processing real-time production data, obtaining results of data analysis of hidden disaster causing and safe production and operation, and performing visual exhibition, so that the advanced mine intelligent management and control platform is provided with functions of predicting and warning of hidden disaster causing, intelligent controlling, patrolling inspecting, safe-production-situation analysis, production-operation decision-making analysis and visual exhibition;

wherein the predicting and warning of hidden disaster causing refers to an exhibition of predicting and warning of geological disasters and hazard source data in the geological survey guarantee system which is the base, by using the predicting model.

6. A construction apparatus of an advanced mine intelligent management and control platform based on a geological survey guarantee system, wherein the construction apparatus of the advanced mine intelligent management and control platform comprises:

a data unifying module, implemented by a computer, wherein the computer, in implementing the data unifying module, is configured for, establishing a unified data standard, and constructing a unified data center comprising multi-source geological survey data and business system data of safe production and operation, to implement unified storage and management of data;

a constructing module, implemented by the computer, wherein the computer, in implementing the constructing module, is configured for, constructing a multi-dimensional (x, y), (x, y, t), (x, y, z) and (x, y, z, t) geological survey guarantee system which uses the unified data center as a data source based on a geographic information system (GIS) or a-computer-aided design (CAD) technique and system, to complete construction of a basic mine intelligent management and control platform and a visual operation interface;

a constructing and updating module, implemented by the computer, wherein the computer, in implementing the constructing and updating module, is configured for, according to engineering exploration and production variation, performing dynamic construction and automatic updating based on multi-dimensional visual geological survey data in the multi-dimensional geological survey guarantee system;

a visualized patrolling inspection, digital twinning and remote industrial control module, implemented by the computer, wherein the computer, in implementing the visualized patrolling inspection, digital twinning and remote industrial control module, is configured for, by using the multi-dimensional geological survey guarantee system as a base, constructing and accessing scenes and data of different types of safe-production systems in the basic mine intelligent management and control platform, to further implement visualized patrolling inspection, digital twinning and remote industrial control; and a result analyzing module, implemented by the computer, wherein the computer, in implementing the result analyzing module, is configured for, according to the multi-dimensional geological survey guarantee system, performing fusion of the multi-source geological survey data and the business system data of safe production and operation, and analysis, decision making and visual exhibition of data of hidden disaster causing and safe production and operation, to form the advanced mine intelligent management and control platform by using the multi-dimensional geological survey guarantee system as the base;

wherein the multi-source geological survey data comprise: geological survey information that reflects a geographic-coordinate location and provided with a multi-dimensional geographic-coordinate feature;

the multi-source geological survey data are basic geographical and space-time information for ensuring normal exploitation of a mine, and provided with a multi-dimensional geographic-coordinate feature, and have data-presentation forms comprising (x, y), (x, y, t), (x, y, z) and (x, y, z, t);

the geographic-coordinate location is a spatial position that is capable of reflecting a location of a geological body, and describes a spatial position between the geological body and a laneway and a working face by using a coordinate system, and in the multi-dimensional (x, y), (x, y, t), (x, y, z) and (x, y, z, t) geological survey guarantee system, x represents a horizontal coordinate describing the geological body based on the coordinate system, y represents a vertical coordinate describing the geological body based on the coordinate system, and z represents an attribute value comprising an elevation or a stratum thickness describing the geological body based on the coordinate system, wherein t represents time information;

the computer, in implementing the constructing module, is configured for:

based on the multi-dimensional geographic-coordinate feature, designing and constructing the multi-dimensional geological survey guarantee system by using the GIS or CAD technique and system, wherein the multi-dimensional geological survey guarantee system exhibits in a two-dimensional, three-dimensional or four-dimensional mode;

in the construction of the basic mine intelligent management and control platform, the basic platform uses complete basic geological survey information and results of data processing and analysis in the multi-dimensional geological survey guarantee system as a basis for storage and exhibition of the basic mine intelligent management and control platform, wherein the complete basic geological survey information refers to geological data and measurement data having multi-dimensional geographic coordinates, the geological data refer to survey data including coal bed, terrane, aquiclude, mine pressure and gas, geological structure and results of working-face coal-terrane identification that are acquired by exploratory boring, geophysical prospecting, chemical exploration and laneway sketching;

the measurement data refer to surveying-and-mapping data of earth surface, laneway, working face and goaf that are formed by engineering construction in a process of mine construction;

the results of data processing and analysis refer to morphologies and characteristics of coal bed or stratum and conditions of spatial distribution of laneway, geological reserve, construction, hydrology, gas, mine pressure and rock-or-stratum physical-property parameter that are obtained by processing and professional analysis on the complete basic geological survey information;

the visual operation interface displays the complete basic geological survey information and the results of data processing and analysis on a screen by using the GIS or CAD technique, and is capable of operating a displayed interface;

a mode of a visualization comprises a two-dimensional mode, a three-dimensional mode and a four-dimensional mode, and the operating refers to interaction with the multi-dimensional basic geological survey information and the results of data processing and analysis in the visual interface by using a mouse, a keyboard, screen touching and voice controlling;

the multi-source geological survey data comprise: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological realistic data, rock-or-stratum physical-property-parameter data, coal-terrane-identification data, and special-subject graphic data comprising results of disaster analysis on geological structure, hydrology, gas, spontaneous combustion of coal bed and mine ground pressure;

a geological-guarantee function comprises: storing, exhibiting, inquiring and operating spatial distribution of laneways, coal beds and other stratums, and an abnormal region and an abnormal value, and exhibiting essential information and abnormal information of stope faces and driving working faces, wherein the abnormal region refers to a region where mine pressure, gas or hydrology is abnormal or a region where a coal bed has a characteristic of spontaneous combustion;

the multi-dimensional geological survey guarantee system is provided with basic features comprising a system-architecture-mode feature, an essential-information-exhibition feature, and a time-space analysis-and-application feature;

the system-architecture-mode feature refers to that an architecture of the multi-dimensional geological survey guarantee system supports architectures of B/S and C/S, and satisfies a mode of cloud deployment;

the essential-information-exhibition feature refers to that the multi-dimensional geological survey guarantee system implements visual exhibition of the multi-source geological survey data, comprising: coal-bed information, coal-bed-spontaneous-combustion feature information, drilling information, fault information, laneway information, pools-zone information, goaf information, collapse-column information, and gas-and-mine-pressure abnormal-region information, and a mode of the exhibition comprises a two-dimensional mode, a three-dimensional mode and a four-dimensional mode;

the time-space analysis-and-application feature refers to that the multi-dimensional geological survey guarantee system performs visual exhibition and inquiring of abnormal regions and abnormal values of mine pressure, gas, hydrology, and characteristic of spontaneous combustion of coal bed, exhibits the essential information and the abnormal information of the stope faces and the driving working faces, and is capable of exhibiting coal-mine stratum, geological structure, coal bed, coal quality, gas, hydrogeology and other geological conditions, geological features and change rules based on a geological survey model and an engineering-data model; and the multi-dimensional geological survey guarantee system is provided with relevant geological-survey-guarantee-type functions of high-precision geological modeling, laneway modeling, transparent working face, three-dimensional-space-information analysis and historical-data consulting, and hidden-disaster-causing analysis, wherein the hidden-disaster-causing analysis refers to performing predicting and warning analysis on mine hazard sources and disaster data.

7. The construction apparatus of the advanced mine intelligent management and control platform according to claim 6, wherein the unified data standard comprises: a unified master-data standard, a unified data-interface standard, a unified GIS or CAD standard and a unified hardware-system data-interface standard; and the computer, in implementing the data unifying module, is configured for, for the multi-source geological survey data and the business system data of safe production and operation, determining types of master data that are required to be integrated into the basic mine intelligent management and control platform according to the unified data-interface standard;

according to the types of the master data and the unified master-data standard, performing a data unifying operation to the master data, to define identification marks of different types of the master data, wherein different identification marks represent different types of the master data; and for GIS information or CAD information comprised in the multi-source geological survey data and the business system data of safe production and operation, performing unified processing according to the unified GIS or CAD standard, to obtain corresponding and unified geographic coordinates;

wherein the multi-source geological survey data comprise: drilling data, mine-surveying data, well-logging data, three-dimensional seismic data, channel-wave seismic data, transient-electromagnetism and audio-electric-penetration data, high-density-electrical-method data, direct-current-method data, in-hole-geophysical-prospecting data, laneway-geological realistic data, rock-or-stratum physical-property-parameter data, coal-terrane-identification data, and special-subject graphic data comprising results of disaster analysis on geological structure, hydrology, gas, spontaneous combustion of coal bed and mine ground pressure; and the business system data of safe production and operation comprise: risk-management and control data, hidden-trouble-investigation data, safe-production-standardization data, three-violation-management data, weak-personnel-management data, emergency-rescue data, comprehensive-dispatching data, production-management data, electro-mechanical-transportation data, One-Ventilation-and-Three-Prevention data, monitoring data, excavation data, comprehensive-automation-and-intellectualization data, and special-subject graphic data other than geological survey.

8. The constructing apparatus of the advanced mine intelligent management and control platform according to claim 7, wherein data of engineering exploration and production variation comprise: multi-dimensional graphics or models processed based on a GIS or CAD system; and the computer, in implementing the constructing and updating module, is configured for:

receiving the graphics or geological-survey-description information, and, performing data processing to the graphics or geological-survey-description information by using a visualization software, wherein the data processing comprises performing unified processing based on the unified GIS or CAD standard, to convert and process coordinates in the graphics into corresponding and unified geographic coordinates, and to obtain a graphic or model result;

based on the graphic or model result formed after the unified processing, performing dynamic construction to the multi-dimensional visual geological data in the multi-dimensional geological survey guarantee system, wherein the dynamic construction comprises: performing high-precision modeling to geological bodies comprising a coal bed, a drilled hole, a fault, a laneway, a pools zone, a goaf and a collapse column, and verifying and correcting existing geological survey information or newly establishing non-existing geological survey information; and performing data processing, storing and entering into the data center according to data changing along with mining and exploration, and the unified data standard, and performing automatic updating of the multi-dimensional visual geological survey data in the multi-dimensional geological survey guarantee system.

* * * * *